United States Patent
Cheng et al.

(10) Patent No.: US 10,804,136 B2
(45) Date of Patent: Oct. 13, 2020

(54) FIN STRUCTURES WITH BOTTOM DIELECTRIC ISOLATION

(71) Applicant: International Business Machines Corporation, Armonk, NY (US)

(72) Inventors: Kangguo Cheng, Schenectady, NY (US); Chun-Chen Yeh, Danbury, CT (US); Tenko Yamashita, Schenectady, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/247,545

(22) Filed: Jan. 14, 2019

(65) Prior Publication Data

US 2020/0227306 A1    Jul. 16, 2020

(51) Int. Cl.
| | |
|---|---|
| H01L 21/762 | (2006.01) |
| H01L 29/66 | (2006.01) |
| H01L 29/78 | (2006.01) |
| H01L 21/84 | (2006.01) |
| H01L 21/306 | (2006.01) |

(52) U.S. Cl.
CPC ........ H01L 21/7624 (2013.01); H01L 21/845 (2013.01); H01L 29/6681 (2013.01); H01L 29/785 (2013.01); H01L 21/30604 (2013.01)

(58) Field of Classification Search
CPC ............... H01L 21/845; H01L 27/0886; H01L 27/0924; H01L 27/10826; H01L 27/10879; H01L 27/1211; H01L 29/41791; H01L 29/66795
See application file for complete search history.

(56) References Cited

U.S. PATENT DOCUMENTS

| | | | |
|---|---|---|---|
| 8,692,316 B2 | 4/2014 | Xie | |
| 9,305,825 B2 | 4/2016 | Youn et al. | |
| 9,735,273 B1 * | 8/2017 | Leobandung | ....... H01L 29/7848 |
| 9,941,279 B2 | 4/2018 | Ching et al. | |
| 2014/0346612 A1 * | 11/2014 | Adam | ............... H01L 21/76205 |
| | | | 257/397 |
| 2017/0178964 A1 | 6/2017 | Liaw | |
| 2017/0309647 A1 * | 10/2017 | Basker | ................ H01L 27/1211 |
| 2018/0033699 A1 | 2/2018 | Zhu | |
| 2018/0102278 A1 | 4/2018 | Chiang et al. | |

FOREIGN PATENT DOCUMENTS

EP        3179506 A1      6/2017

OTHER PUBLICATIONS

Maszara,W.P. et al., FinFETs—Technology and Circuit Design Challenges, http://zapdf.com/finfets-technology-and-circuit-design-challenges.html, 2013, pp. 3-8, IEEE.

* cited by examiner

*Primary Examiner* — Julia Slutsker
(74) *Attorney, Agent, or Firm* — Douglas Pearson; Otterstedt, Wallace & Kammer, LLP (57) ABSTRACT

Semiconductor fins of a monolithic semiconductor structure are electrically isolated using a dielectric material at the bottoms of the fins. Relatively tall semiconductor fins can be fabricated at a relatively narrow fin pitch while avoiding mechanical instability. The semiconductor fins are grown on sidewalls of semiconductor mandrels and over a dielectric layer. The semiconductor fins are supported during mandrel removal to provide mechanical stability. The semiconductor fins can be employed as channel regions of FinFET devices.

6 Claims, 5 Drawing Sheets

FIN STRUCTURES WITH BOTTOM DIELECTRIC ISOLATION

BACKGROUND

The present inventions relate generally to the electrical, electronic and computer arts and, more particularly, to finned semiconductor structures and the fabrication of such structures with dielectric bottom isolation.

Fin-type field-effect transistors (FinFETs) have three-dimensional, non-planar configurations including fin-like structures extending above substrates. The substrates may include semiconductor on insulator (SOI) substrates or bulk semiconductor substrates. Semiconductor fins are formed in some FinFETs on substrates via known technology such as sidewall image transfer (SIT). FinFET structures including SOI substrates can be formed, in part, by selectively etching the crystalline silicon or other semiconductor layers down to the oxide or other electrically insulating layers thereof following photolithography. Active fin heights, the channel fin region where the flow of electrical current is controlled by the gate, are set by SOI thickness when employing SOI substrates. In bulk FinFETs, active fin heights can be set by doping bottom portions of fins and the depths of gate wrap around. An exemplary process flow for forming monolithic fin structures from bulk semiconductor substrates includes: 1) fin mandrel patterning; 2) sidewall spacer formation; 3) fin mandrel removal; 4) fin RIE (reactive ion etch); 5) STI (shallow trench isolation) fill and fin reveal. The gates of FinFETs can be formed using a "gate-first" process wherein a gate stack and spacers are formed prior to selective epitaxial growth wherein source and drain regions are enlarged. A "gate-last" process may alternatively be employed wherein a permanent gate stack is formed after forming source and drain regions. Gate-last procedures can involve forming a dummy gate, fabricating other elements of the transistor such as the source/drain regions, removing the dummy gate, and replacing the removed dummy gate with actual gate materials.

BRIEF SUMMARY

Techniques are provided for enabling the integration of tall semiconductor fins at tight pitches with dielectric isolation. Monolithic semiconductor structures including bottom-isolated fins on dielectric material are further provided.

In one aspect, a method of fabricating a monolithic semiconductor structure including bottom-isolated semiconductor fins is provided. The method includes obtaining a mandrel structure including a plurality of vertically extending semiconductor mandrels, each of the semiconductor mandrels including a top portion having exposed sidewalls and a bottom portion beneath the top portion. The mandrel structure further includes a first dielectric layer between each of the semiconductor mandrels. Semiconductor fins are epitaxially grown on the exposed sidewalls of the top portions of the semiconductor mandrels and over a top surface of the first dielectric layer. A sacrificial layer is deposited over the first dielectric layer and between the semiconductor fins. The top portions of the semiconductor mandrels are removed, thereby forming vertical trenches extending between pairs of the semiconductor fins and beneath the top surface of the first dielectric layer. A second dielectric layer is formed within the trenches and directly above the bottom portions of the semiconductor mandrels. The sacrificial layer is removed subsequent to removing the top portions of the semiconductor mandrels.

In a further aspect, a monolithic semiconductor structure includes bottom-isolated semiconductor fins. The structure includes a substrate including a plurality of vertically extending semiconductor mandrels and a plurality of recesses between the semiconductor mandrels. Each of the semiconductor mandrels includes a top surface. A first dielectric layer on the substrate extends within the recesses between each of the semiconductor mandrels. Vertical trenches extend within the first dielectric layer down to the top surfaces of the semiconductor mandrels. A second dielectric layer extends within the vertical trenches. Parallel, vertically extending semiconductor fins have bottom ends adjoining the first dielectric layer.

Techniques as disclosed herein can provide substantial beneficial technical effects. By way of example only and without limitation, one or more embodiments may provide one or more of the following advantages:

Increased fin height with mechanical stability;
Improved short channel control;
Reduced parasitic capacitance.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present inventions will be described herein in the context of illustrative embodiments. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

A FinFET structure may include semiconductor fins formed in a substrate. The semiconductor fins are typically etched in semiconducting material having (100) crystallographic top surface and are oriented along <110> directions. In this arrangement, the fin top surface is the (100) crystallographic plane and the fin side surfaces are (110) crystallographic planes. The semiconducting material can include silicon or silicon germanium. The thickness of semiconducting fins can, for example, be from 5 nm to 15 nm. The height of semiconducting fins can be from 25 nm to 150 nm, although lesser and greater height can also be employed. The fin spatial period or the fin pitch can be between 25 nm and 60 nm. Lesser or greater fin pitch may, however, be desired for some applications. The semiconductor fins can be isolated from each other and/or from the substrate using isolation dielectric plugs formed between fins and/or underneath the fins. The dielectric isolation plugs can include a dielectric material such as silicon oxide, silicon nitride, or silicon oxynitride. The fin height above the top surface of isolation dielectric plugs can, for example, be from 25 nm to 75 nm.

In order to obtain better gate control of a FinFET device, local STI may be recessed deeply in a replacement metal gate (RMG) process. The deep recessing of STI material can cause relatively high levels of unwanted parasitic capacitance. The exemplary processes as described below help reduce parasitic capacitance of FinFET devices. In addition, bottom dielectric electrical isolation of the semiconductor fins improves the leakage path at the fin bottoms.

FinFET scaling may require relatively tall semiconductor fins (45 nm or more), narrow fin pitches (for example a fin pitch of 16-30 nm), and semiconductor fin thicknesses less than ten nanometers (10 nm). Such scaling may be difficult to achieve due to mechanical instability of the fins and/or fin reveal non-uniformity. Mechanical instability may result in the fins bending from desired vertical orientations. Fin reveal non-uniformity results from non-uniform thickness of dielectric (STI) material, such as silicon dioxide, between fins. Processes as discussed below enable the fabrication of relatively tall fins without such mechanical instability or fin reveal non-uniformity while obtaining a finned structure having a narrow fin pitch.

Figure 1:
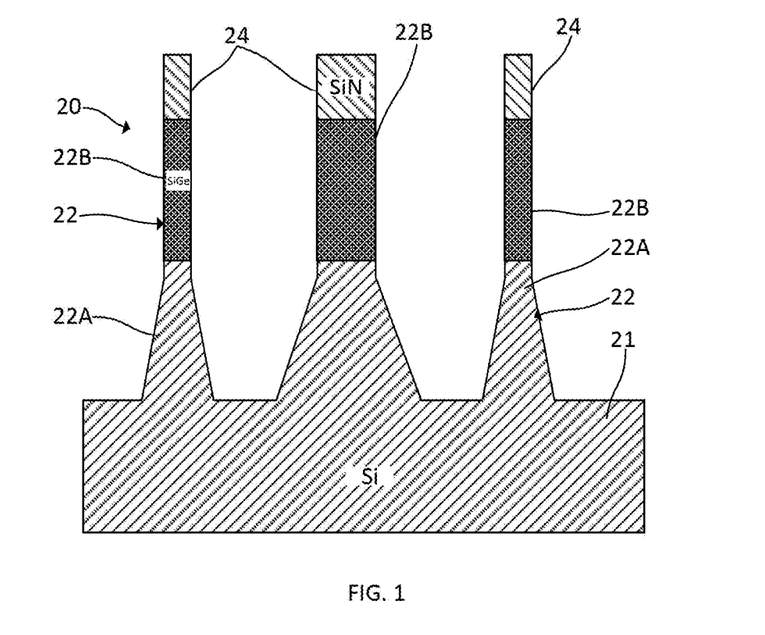
FIG. 1 is a schematic, cross-sectional view of an exemplary monolithic mandrel structure following fin mandrel formation on a semiconductor substrate.

FIGS. 1-9 provide cross-sectional views of a process flow for forming a monolithic structure including semiconductor fins with bottom electrical isolation. Referring to FIG. 1, an initial monolithic structure 20 includes fin-like, vertically extending semiconductor mandrels 22 formed, in part, from a substrate layer 21. A bulk semiconductor substrate or a crystalline semiconductor layer, which can be referred to as an SOI layer, of a semiconductor-on-insulator substrate, can be employed as the substrate layer. The substrate layer 21 is essentially undoped or lightly doped in one or more embodiments and the semiconductor mandrels 22 are substantially monocrystalline. A dry etch may be employed for mandrel patterning. The mandrels 22 comprise silicon base portions 22A and silicon germanium top portions 22B in the exemplary structure 20. The silicon base portions 22A include converging sidewalls. The width of the silicon base portions 22A accordingly decreases in the vertical direction from the substrate layer 21. The sidewalls of the silicon germanium portions 22B of the mandrels are ideally entirely vertical, though in practice they may be slightly inclined. (During a dry etch, the top portions of the trench sidewalls usually have a much straighter profile than the bottom portions of the trenches, resulting in mandrel configurations as described herein.) Silicon nitride caps 24 adjoin the top surfaces of the mandrels 22. The caps 24 are portions of a patterned hard mask that remains on the mandrels following fin mandrel patterning. As the mandrels 22 are greater in width than the later-formed fins (not shown in FIG. 1) used to form channel regions of FinFETs, they will not tend to bend or collapse.

Figure 2:
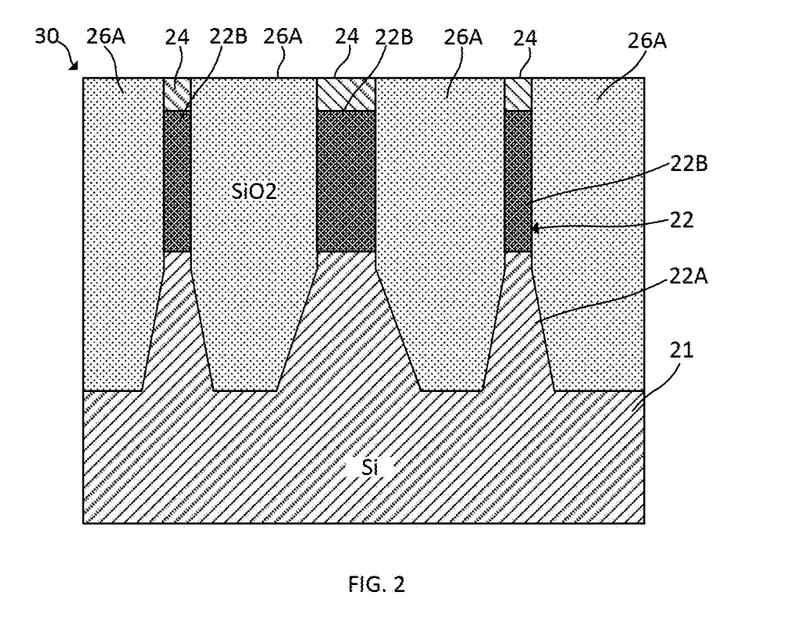
FIG. 2 is a schematic, cross-sectional view thereof following deposition of a first dielectric layer on the monolithic structure and chemical mechanical planarization.
Figure 3:
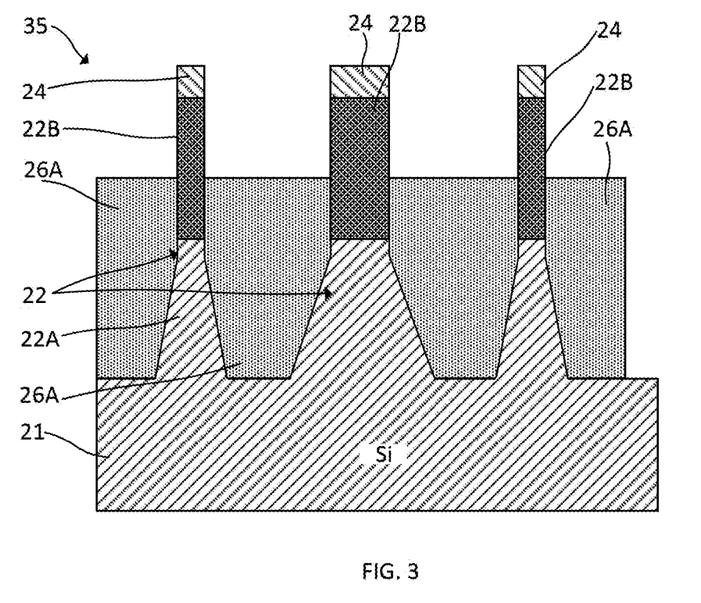
FIG. 3 is a schematic, cross-sectional view thereof following fin mandrel reveal.

A dielectric layer 26A is deposited on the structure 20 and subjected to chemical mechanical planarization (CMP) down to the top surfaces of the silicon nitride caps 24. The dielectric layer 26A may, for example, be a flowable oxide such as silicon dioxide in one exemplary embodiment. Other dielectric materials may alternatively be employed in some embodiments, though etch selectivity between the dielectric layer 26A and the caps 24 and mandrels 22 should be provided. The dielectric layer is deposited by any suitable deposition process including but not limited to CVD, PVD, plasma-enhanced CVD, atomic layer deposition (ALD), evaporation, chemical solution deposition, or like processes. A structure 30 as schematically illustrated in FIG. 2 is thereby obtained wherein dielectric material fills the recesses between the mandrels 22. A timed, selective etch causes the removal of the top portion of the dielectric layer 26A. An etch chemistry that is selective to the caps 24 and to the silicon germanium mandrel material is employed. As discussed further below, the silicon germanium portions 22B of the mandrels are configured to later allow epitaxial growth on the sidewalls thereof. The spaces between fin mandrels are sufficiently wide to allow a uniform fin mandrel reveal. In an exemplary embodiment, such spaces have widths of at least ten nanometers and are preferably between twenty and one hundred nanometers (20-100 nm). The etch is discontinued once a desired portion (though not all) of the silicon germanium mandrel portions 22B are revealed. The bottom portions of the silicon germanium mandrel portions accordingly remain embedded within the dielectric layer 26A. A structure 35 as schematically illustrated in FIG. 3 may accordingly be obtained.

Figure 4:
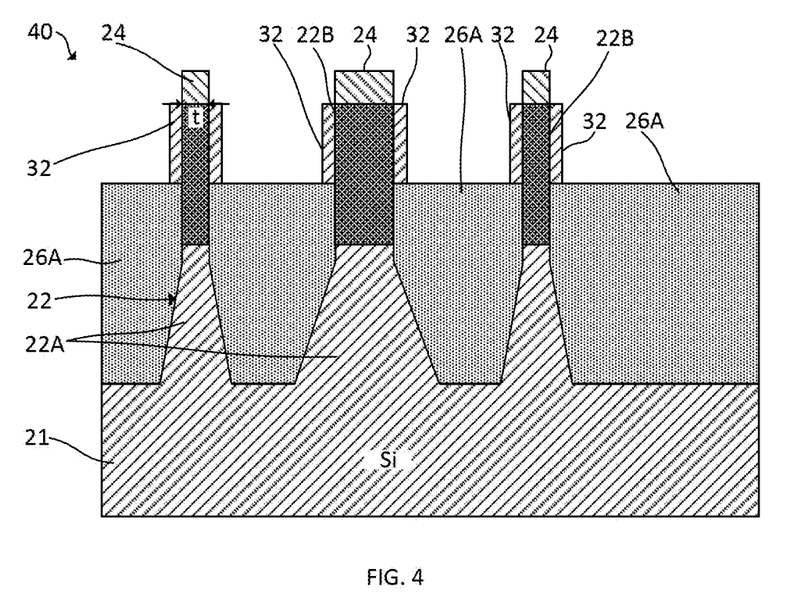
FIG. 4 is a schematic, cross-sectional view thereof following uniform lateral, epitaxial fin growth on the sidewalls of the fin mandrels.

Referring to FIG. 4, fin (FinFET channel) material is epitaxially and selectively grown on the exposed vertical sidewalls of the silicon germanium mandrel portions 22B. The terms "epitaxially growing and/or depositing" and "epitaxially grown and/or deposited" mean the growth of a semiconductor material on a deposition surface of a semiconductor material in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. The epitaxial deposition process may employ the deposition chamber of a chemical vapor deposition type apparatus, such as a low pressure chemical vapor deposition (LPCVD). Exemplary epitaxial growth processes that are suitable for use in forming silicon epitaxy include chemical vapor deposition (CVD), "pulsed" or "atomic layer" chemical vapor deposition/epitaxy, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition processes typically ranges from 450° C. to 900° C. A number of different precursors may be used for the epitaxial deposition of the fin semiconductor material. In embodiments where the deposited material includes silicon, the gas source may include silicon (Si) deposited from silane, disilane, trisilane, tetrasilane, hexachlorodisilane, tetrachlorosilane, dichlorosilane, trichlorosilane, disilane and combinations thereof. The epitaxial deposition process may be tuned to provide the growth of conformal layers as illustrated in the figures as opposed to faceted structures.

The resulting structure 40, as schematically illustrated in FIG. 4, includes sets of vertically extending semiconductor fins 32 having substantially uniform height and thickness dimensions. Thickness variation may be less than three percent (3%) in some embodiments. Fin height is determined by the distance the silicon germanium mandrel portions extend above the top surface of the previously recessed dielectric layer 26A. Uniformity of fin height is facilitated by the uniformity of the mandrel reveal. Fin thickness is determined by the time and rate of fin material deposition. The thicknesses t of the silicon germanium mandrel portions 22B and the distances between mandrels determines fin spacing. As schematically illustrated in FIG. 4, the thicknesses of the revealed portions of the mandrels 22 are much larger than the thicknesses of the semiconductor fins 32 grown on the vertical sidewalls thereof. In one exemplary embodiment, epitaxial fin growth on the silicon germanium mandrel portions 22B provides a set of monocrystalline silicon fins 32, each having a height of sixty nanometers (60 nm) and a thickness of five nanometers (5 nm). Some fins are grown on mandrel portions having thicknesses t of twenty nanometers (20 nm) in an exemplary embodiment. Other fins may be grown on thicker mandrel portions (as illustrated in FIG. 4) and/or thinner mandrel portions on the same substrate.

The bottom end of each epitaxially grown fin 32 adjoins the top surface of the dielectric layer 26A, which provides bottom isolation. The top surface of each fin 32 is essentially coplanar with the top surface of each top mandrel portion 22B. The dielectric layer 26A following CMP and mandrel reveal (FIGS. 2-3) comprises a plurality of dielectric plugs within the recesses between mandrels 22. The upper portions of the dielectric plugs have vertical sidewalls that adjoin the vertical sidewalls of the top portions 22B of the semiconductor mandrels 22. The sidewalls of the lower portions of the dielectric plugs converge inwardly towards the substrate 21. Each of the semiconductor fins 32 and each of the dielectric plugs has a sidewall that adjoins the vertical sidewall of a top mandrel portion 22B. One of the vertical sidewalls of each semiconductor fin 32 is accordingly vertically aligned with one of the vertical sidewalls of the dielectric plugs.

The semiconductor fins 32 may be lightly doped in situ or following deposition, the choice of dopants depending on the type of FinFET (n-type or p-type) to be fabricated. Channel doping is typically opposite to the channel type; the n-channel of an nFET is lightly doped with p-type dopant whereas the p-channel type of a pFET is lightly doped with n-type dopant. Fins for nFETs may, for example, be doped with a p-type dopant such as boron to $1-50 \times 10^{16}$ $cm^{-3}$. Fins for pFETs may, for example, be doped with n-type dopants such as phosphorus or arsenic to $1-50 \times 10^{16}$ $cm^{-3}$.

Figure 5:
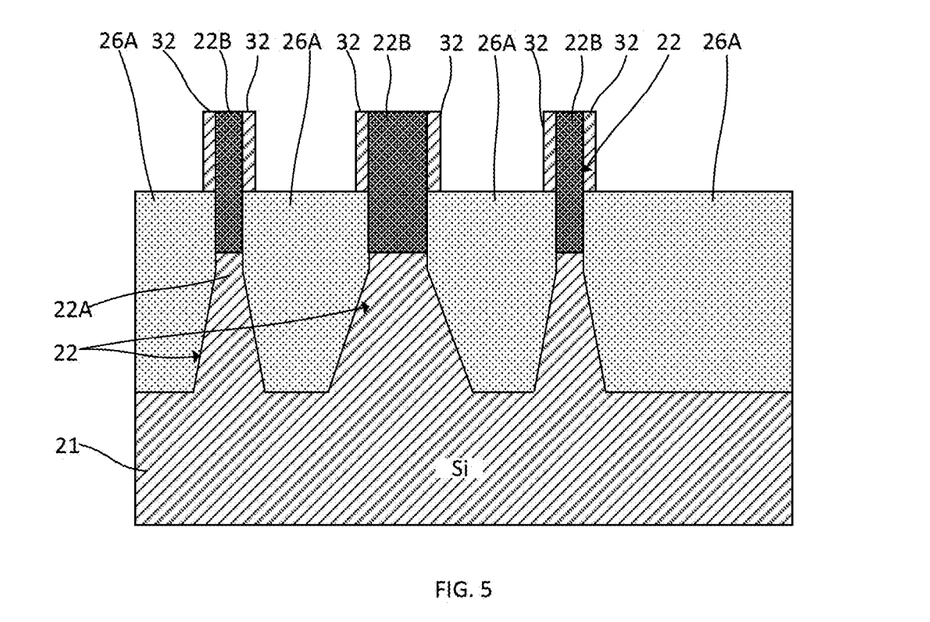
FIG. 5 is a schematic, cross-sectional view thereof following removal of the hard mask from the top surfaces of the fin mandrels.
Figure 6:
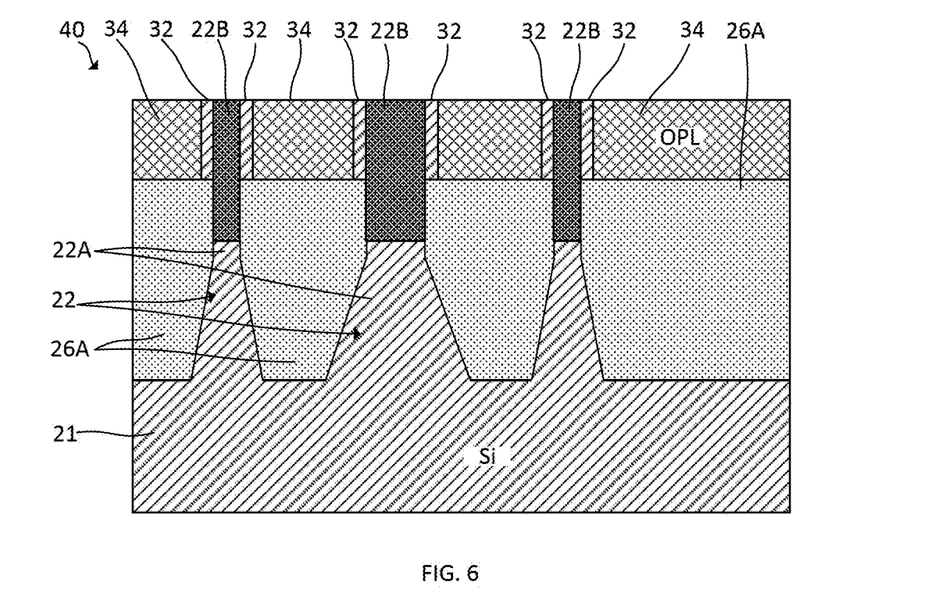
FIG. 6 is a schematic, cross-sectional view thereof following deposition and etch-back of an organic planarization layer on the monolithic structure.

The hard mask (caps 24) is removed from the monolithic mandrel structure, as shown in FIG. 5. The top surfaces of the silicon germanium mandrel portions 22B are accordingly exposed. In embodiments wherein a silicon nitride hard mask is employed, it can be selectively removed using hot $H_3PO_4$ wet chemistry or other suitable process. An organic planarization layer (OPL) 34 is then deposited on the structure and etched back to obtain a structure 45 as shown in FIG. 6 wherein the top surfaces of the silicon germanium mandrel portions 22B are again exposed. A polymethyl methacrylate (PMMA) photoresist film forms the layer 34 in one exemplary embodiment.

Figure 7:
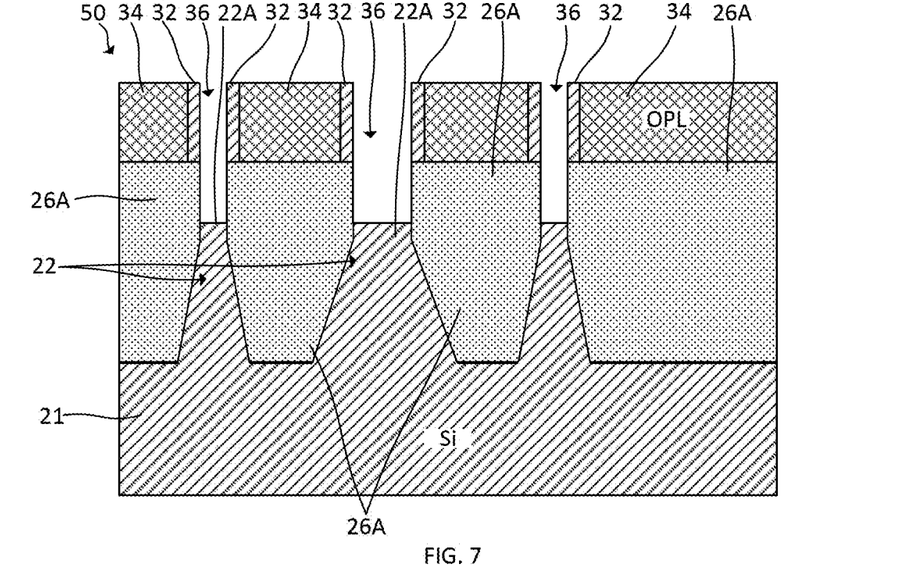
FIG. 7 is a schematic, cross-sectional view thereof following selective removal of the fin mandrels.

The silicon germanium mandrel portions 22B are removed using an etching process that is selective to the silicon portions 22A of the fins 22, the dielectric layer 26A, and the organic planarization layer 34. The germanium content of the silicon germanium portions of the mandrels is sufficient to allow selective etching of such portions. The silicon germanium (top) mandrel portions 22B may have a composition of $Si_{1-x}Ge_x$ wherein x is between 25 and 60. A wet etch process containing ammonia and hydroperoxide can be used to etch SiGe selective to other materials, including silicon. By using the OPL 34 to support the semiconductor fins 32 during silicon germanium removal, bending of the fins is avoided during the etch even if they have relatively long, thin dimensions. As shown in FIG. 7, the resulting structure 50 includes vertical trenches 36 between pairs of semiconductor fins 32 that extend down to the exposed top surfaces of the silicon (bottom) portions 22A of the relatively thick, fin-like mandrels 22. The top surfaces of the silicon portions 22A of the mandrels are coplanar. The trenches 36 also extend through portions of the dielectric layer 26A.

Figure 8:
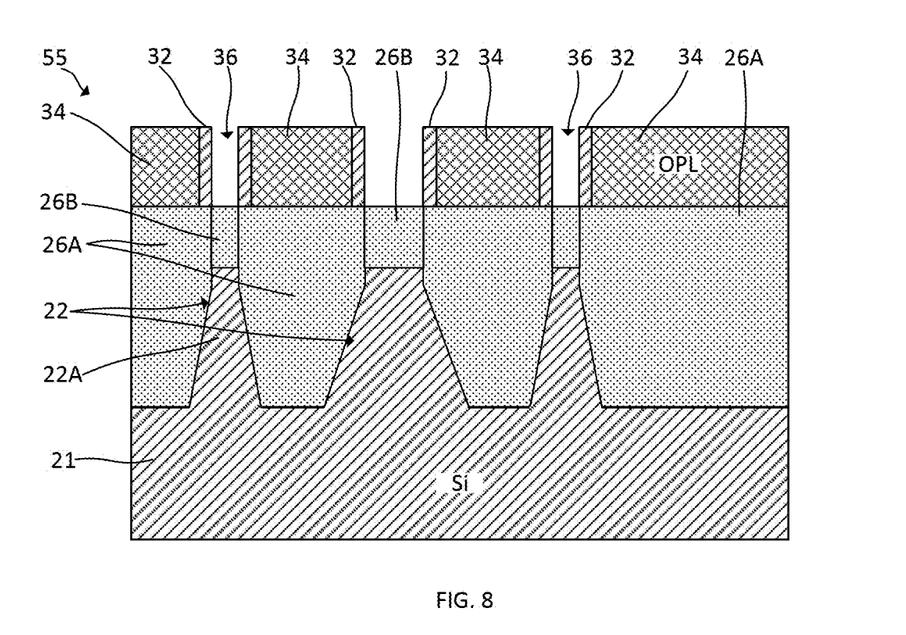
FIG. 8 is a schematic, cross-sectional view thereof following deposition and etch-back of a further dielectric layer.

Referring to the exemplary monolithic structure 55 that is schematically illustrated FIG. 8, a second dielectric layer 26B is deposited on the structure and etched back such that its top surface is coplanar with the top surface of the previously formed dielectric layer 26A. As discussed below, uniform fin reveal is facilitated by the etch-back of the second dielectric layer such that the two dielectric layers 26A, 26B form a planar top dielectric surface. The etch-back process can be effectively tuned for removing material uniformly from relatively narrow trenches. The second dielectric layer 26B may be comprised of the same material as the existing dielectric layer 26A, for example silicon dioxide. Alternatively, other dielectric materials such as silicon nitride may be deposited to form the second layer 26B. Silicon nitride deposited using plasma-enhanced atomic layer deposition (PEALD) is followed by etch-back in some embodiments. PEALD enables the lowering of the deposition temperature such that the silicon nitride film is compatible with OPL material. The second dielectric layer adjoins the top surfaces of the remaining portions of the mandrels 22. Each of the fins 32 has one exposed vertical sidewall and a second vertical sidewall that adjoins the OPL 34. It will be appreciated that either of the first and second dielectric layers can, in some embodiments, be comprised of multiple dielectric layers.

Figure 9:
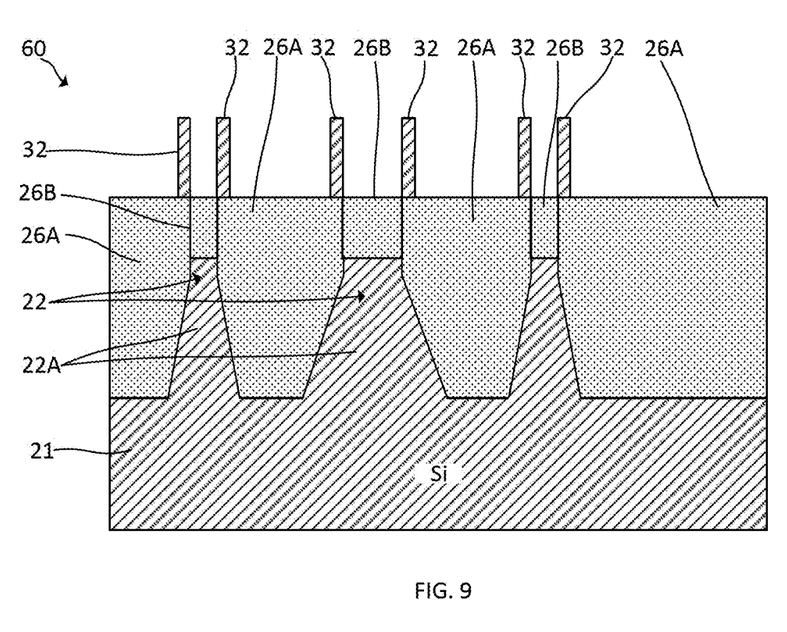
FIG. 9 is a schematic, cross-sectional view thereof following removal of the organic planarization layer.

The organic planarization layer 34 is stripped from the structure 55 to obtain a monolithic structure 60 as schematically illustrated in FIG. 9. The structure 60 includes an array of parallel semiconductor fins 32, each of which has two exposed vertical sidewalls. The revealed fin serves as the basis for forming a transistor channel and is often referred to as an "active" fin portion. The sidewall slope in the active fin portion is preferably less than +/−10 degrees and more preferably less than +/−3 degrees from the vertical.

Dielectric isolation provided by the first dielectric layer 26A improves the leakage path at the bottoms of the semiconductor fins 32 with reduced parasitic capacitance. The first dielectric layer 26A extends down to the top surface of the substrate layer 21 and has a greater thickness than the second dielectric layer 26B which extends down to the top surfaces of the remaining portions of the mandrels 22. The first and second dielectric layers are comprised of the same material in some, though not all embodiments. Advantageously, the fins 32 can be tall (45 nm or more) and thin. Fin pitch can be very narrow if desired, for example less than twenty nanometers. Such dimensions are obtained without fin instability and with uniform fin reveal. Narrow pitch arrays of fins for both pFETs and nFETs can be provided on the same substrate. It will be appreciated that fin cut regions (not shown) can serve as isolation regions between different fin types such as fins formed for nFET and pFET transistors.

Source/drain regions (not shown) can be formed on the semiconductor fins 32 after the formation of disposable gate structures and gate spacers (not shown) have been completed. Either p-channel devices (pFETs) or n-channel devices (nFETs) can be fabricated by matching the source/drain dopant or conductivity type to transistor channel type in inversion, as known in the art. As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. As used herein, "n-type" refers to the addition of impurities that contributes free electrons to an intrinsic semiconductor. Examples of n-type dopants, i.e., impurities in a silicon-containing substrate include but are not limited to antimony, arsenic and phosphorous.

The disposable gate structures are removed by at least one etch employing an etch chemistry that is selective to the gate spacers and to the dielectric materials of a planarization dielectric layer (not shown). Replacement gate structures (not shown) are ordinarily formed in gate cavities by replacement of the disposable structures and overlie channel regions (comprised of the fins 32) of the field-effect transistors. Methods of fabricating FinFET devices using semiconductor fins are known to the art and continue to be developed. A network of metallic interconnects is employed to wire electrical contacts to FinFETs to form useful circuits.

FIGS. 1-9, as discussed above, depict exemplary processing steps/stages in the fabrication of an exemplary structure 60 including vertically extending semiconductor fins 32 and bottom fin isolation provided by a dielectric layer. Although the overall fabrication method and the structures formed thereby are entirely novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example James D. Plummer et al., *Silicon VLSI Technology: Fundamentals, Practice, and Modeling* 1*st* Edition, Prentice Hall, 2001, which is hereby incorporated by reference herein. It is emphasized that while some individual processing steps are set forth herein, those steps are merely illustrative, and one skilled in the art may be familiar with several equally suitable alternatives that would be applicable.

Given the discussion thus far, a method of fabricating a monolithic semiconductor structure including bottom-isolated semiconductor fins 32 is provided as well as a monolithic structure having electrically isolated fins that can be formed using such a method. A method in accordance with the invention includes epitaxially growing semiconductor fins 32 on the exposed vertical sidewalls of the top portions 22B of semiconductor mandrels 22 and over a top surface of a first dielectric layer 26A. A sacrificial layer 34 is deposited over the first dielectric layer and between the semiconductor fins. The top portions of the semiconductor mandrels are removed, thereby forming vertical trenches 36 extending between pairs of the semiconductor fins and beneath the top surface of the first dielectric layer 26A. Such trenches are shown in FIG. 7. A second dielectric layer 26B is formed within the trenches and directly above the bottom portions of the semiconductor mandrels, which remain following removal of the top portions thereof. The sacrificial layer is removed subsequent to removing the top portions of the semiconductor mandrels. In an exemplary embodiment, the top portions of the semiconductor mandrels comprise silicon germanium and their removal is selective to the bottom portions of the semiconductor mandrels. In one or more embodiments, the top portions 22B of the semiconductor mandrels adjoin the bottom portions 22A thereof below the top surface of the first dielectric layer 26A. The trenches 36 accordingly extend within the first dielectric layer 26A following selective removal of the top portions 22B of the semiconductor mandrels 22. The second dielectric layer 26B is etched back down to a level coplanar with the top surface of the first dielectric layer 26A. The distance between the vertical sidewall portions of each discrete portion of the first dielectric layer 26A is greater than the widths of the trenches 36 therein in one or more embodiments. Accordingly, the distances between semiconductor fins on each discrete portion of the first dielectric layer may be greater than the distances between fins on opposite sides of each trench 36.

It is to be appreciated that the various layers and/or regions shown in the accompanying figures may not be drawn to scale. Furthermore, one or more semiconductor layers of a type commonly used in such integrated circuit devices or other layers may not be explicitly shown in a given figure for ease of explanation. This does not imply that the semiconductor layer(s) or other layer(s) not explicitly shown are omitted in the actual integrated circuit device.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from finned structures formed in accordance with one or more of the exemplary embodiments.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A method of fabricating a monolithic semiconductor structure including bottom-isolated semiconductor fins, comprising:
    obtaining a mandrel structure including:
        a plurality of vertically extending semiconductor mandrels, each of the semiconductor mandrels including a top portion having exposed sidewalls and a bottom portion beneath the top portion, and
        a first dielectric layer between each of the semiconductor mandrels;
    epitaxially growing semiconductor fins on the exposed sidewalls of the top portions of the semiconductor mandrels and over a top surface of the first dielectric layer;
    depositing a sacrificial layer over the first dielectric layer and between the semiconductor fins;
    removing the top portions of the semiconductor mandrels, thereby forming vertical trenches extending between pairs of the semiconductor fins and beneath the top surface of the first dielectric layer;
    forming a second dielectric layer within the trenches and directly above the bottom portions of the semiconductor mandrels; and
    removing the sacrificial layer subsequent to removing the top portions of the semiconductor mandrels;
    wherein the top portions of the semiconductor mandrels comprise silicon germanium;
    wherein removing the top portions of the semiconductor mandrels includes selectively removing the top portions of the semiconductor mandrels with respect to the bottom portions of the semiconductor mandrels;
    wherein the top portions of the semiconductor mandrels adjoin the bottom portions of the semiconductor mandrels below the top surface of the first dielectric layer; and
    wherein forming the second dielectric layer includes depositing the second dielectric layer within the vertical trenches, and etching back the second dielectric layer down to a level coplanar with the top surface of the first dielectric layer.

2. The method of claim 1, wherein the mandrel structure further includes a hard mask comprising a plurality of dielectric caps on the top portions of the semiconductor mandrels, further including removing the hard mask subsequent to epitaxially growing the semiconductor fins.

3. The method claim 2, wherein the mandrel structure further includes a silicon substrate layer, the bottom portions of the semiconductor mandrels being integral with the silicon substrate layer.

4. The method of claim 2, wherein at least one of the top portions of the semiconductor mandrels has a thickness of twenty nanometers or less.

5. The method of claim 4, wherein the semiconductor fins have thicknesses of less than ten nanometers upon completion of epitaxially growing the semiconductor fins, the thicknesses of the semiconductor fins being less than the thicknesses of each of the top portions of the semiconductor mandrels.

6. The method of claim 5, wherein each of the semiconductor fins grown on the exposed sidewalls of the top portions of the semiconductor mandrels has a height exceeding forty-five nanometers.

* * * * *